(12) United States Patent
Okoli et al.

(10) Patent No.: US 10,916,713 B2
(45) Date of Patent: Feb. 9, 2021

(54) WIRE-SHAPED PEROVSKITE STRUCTURES AND METHODS FOR MANUFACTURE THEREOF

(71) Applicant: The Florida State University Research Foundation, Inc., Tallahassee, FL (US)

(72) Inventors: Okenwa O. I. Okoli, Tallahassee, FL (US); Geoffrey R. Adams, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 0 days.

(21) Appl. No.: 16/746,021

(22) Filed: Jan. 17, 2020

(65) Prior Publication Data
US 2020/0235316 A1    Jul. 23, 2020

Related U.S. Application Data

(60) Provisional application No. 62/794,285, filed on Jan. 18, 2019.

(51) Int. Cl.
| | |
|---|---|
| *H01L 51/00* | (2006.01) |
| *C09D 5/00* | (2006.01) |
| *D07B 5/00* | (2006.01) |
| *D01F 11/14* | (2006.01) |
| *G01J 1/42* | (2006.01) |
| *H01L 51/52* | (2006.01) |
| *C01B 32/168* | (2017.01) |

(Continued)

(52) U.S. Cl.
CPC ........ *H01L 51/0077* (2013.01); *C01B 32/168* (2017.08); *C09D 5/00* (2013.01); *D01F 11/14* (2013.01); *D07B 5/00* (2013.01); *G01J 1/42* (2013.01); *H01L 51/0048* (2013.01); *H01L 51/0097* (2013.01); *H01L 51/5287* (2013.01); *C01B 2202/22* (2013.01); *D07B 2205/3007* (2013.01); *H01L 51/0003* (2013.01); *H01L 51/0021* (2013.01); *H01L 51/4253* (2013.01); *H01L 51/441* (2013.01); *H01L 51/5012* (2013.01); *H01L 51/56* (2013.01); *H01L 2251/5338* (2013.01)

(58) Field of Classification Search
None
See application file for complete search history.

(56) References Cited

U.S. PATENT DOCUMENTS

2020/0168822 A1*  5/2020  Roqan ................ H01L 51/0002

OTHER PUBLICATIONS

Yang, Y., Feng, S., Li, M. et al. Annealing Induced Re-crystallization in CH3NH3PbI3-xClx for High Performance Perovskite Solar Cells. Sci Rep 7, 46724 (2017). https://doi.org/10.1038/srep46724. (Year: 2017).*

(Continued)

*Primary Examiner* — J. E. Schoenholtz
(74) *Attorney, Agent, or Firm* — Eversheds Sutherland (US) LLP

(57) ABSTRACT

Wire-shaped perovskite devices and methods for manufacturing the same are provided. The perovskite devices have a uniform layer thickness of perovskite material on wire-shaped substrates of semi-conductor or carbon material. The method includes an electro-coating process, which advantageously allows for predictability and repeatability.

20 Claims, 14 Drawing Sheets

(51) Int. Cl.
H01L 51/42 (2006.01)
H01L 51/50 (2006.01)
H01L 51/44 (2006.01)
H01L 51/56 (2006.01)

(56) References Cited

OTHER PUBLICATIONS

Adams, G. R., Adhikari, N., Parker, H., Okoli, O., Adv. Mater. Interfaces 2018, 5, 1800082 https://doi.org/10.1002/admi.201800082 (Year: 2018).*

Lee, M., Y. Ko, and Y. Jun, Efficient fiber-shaped perovskite photovoltaics using silver nanowires as top electrode. Journal of Materials Chemistry A, 2015. 3(38): p. 19310-13.

Li, R., et al., Wearable Double-Twisted Fibrous Perovskite Solar Cell. Advanced Materials, 2015. 27(25): p. 3831-35.

Peng, M. and D. Zou, Flexible fiber/wire-shaped solar cells in progress: Properties, materials, and designs. Journal of Materials Chemistry A, 2015. 3(41): p. 20435-20458.

Jeon, N.J., et al., Solvent engineering for high-performance inorganic-organic hybrid perovskite solar cells. Nature materials, 2014. 13(9): p. 897-903.

Dou, L., et al., Solution-processed hybrid perovskite photodetectors with high detectivity. Nature communications, 2014. 5: p. 5404.

He, S., et al., Radically grown obelisk-like ZnO arrays for perovskite solar cell fibers and fabrics through a mild solution process. Journal of Materials Chemistry A, 2015. 3(18): p. 9406-10.

Adhikari, N., et al., Crystallization of a perovskite film for higher performance solar cells by controlling water concentration in methyl ammonium iodide precursor solution. Nanoscale, 2016. 8(5): p. 2693-703.

Eperon, G.E., et al., Morphological control for high performance, solution-processed planar heterojunction perovskite solar cells. Advanced Functional Materials, 2014. 24(1): p. 151-157.

Venkatesan, S., et al., Benzothiadiazole-based polymer for single and double junction solar cells with high open circuit voltage. Nanoscale, 2014. 6(12): p. 7093-100.

Tidhar, Y., et al., Crystallization of methyl ammonium lead halide perovskites: implications for photovoltaic applications. J. American Chemical Society, 2014. 136(38): p. 13249-56.

Zhang S. et al., Preparations and characterizations of luminescent two dimensional organic-inorganic perovskite semiconductors. Materials, 2010. 3(5): p. 3385-406.

Grätzel, M., The light and shade of perovskite solar cells. Nature materials, 2014. 13(9): p. 838-842.

Heckler, G. A silicon photodevice to operate in a photon flux integrated mode. in Electron Devices Meeting, 1965 International. 1965. IEEE.

* cited by examiner

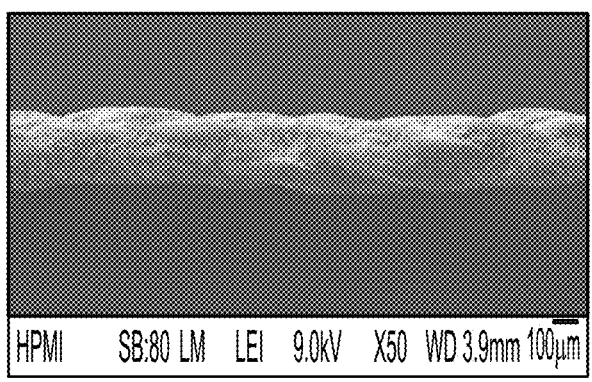 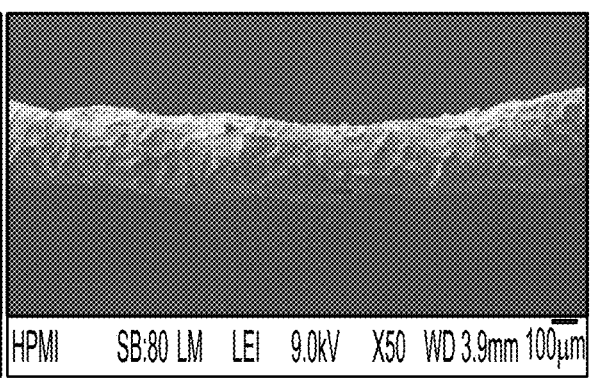
FIG. 5A　　　　　　　　　FIG. 5B
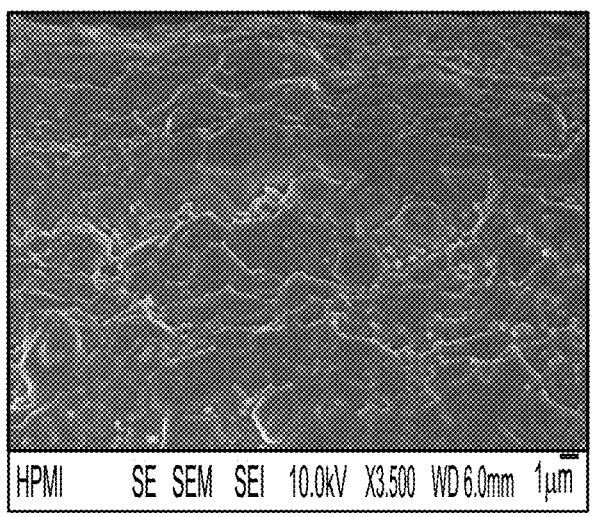 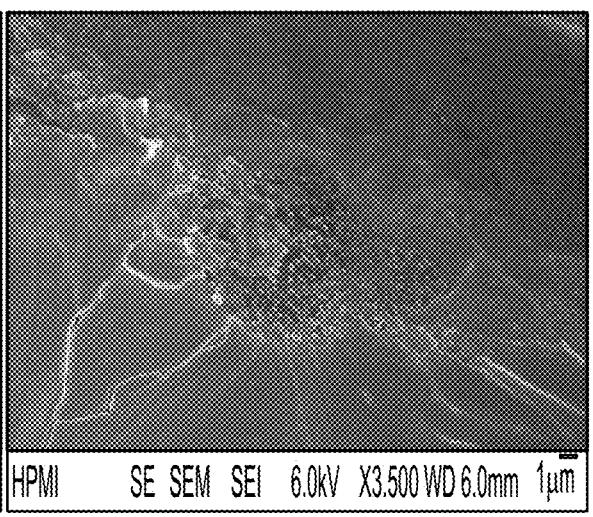
FIG. 5C　　　　　　　　　FIG. 5D
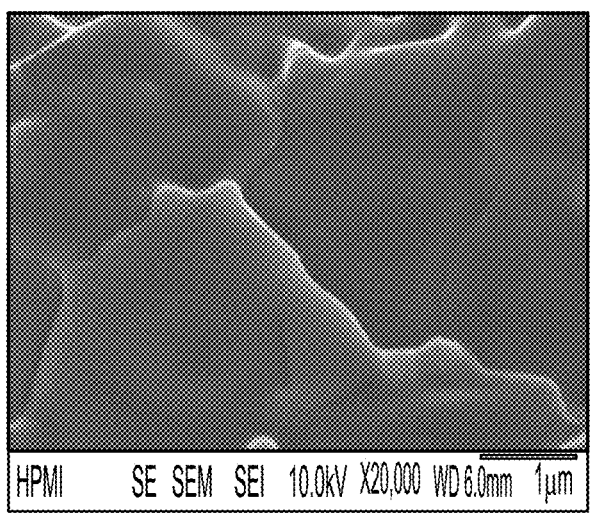 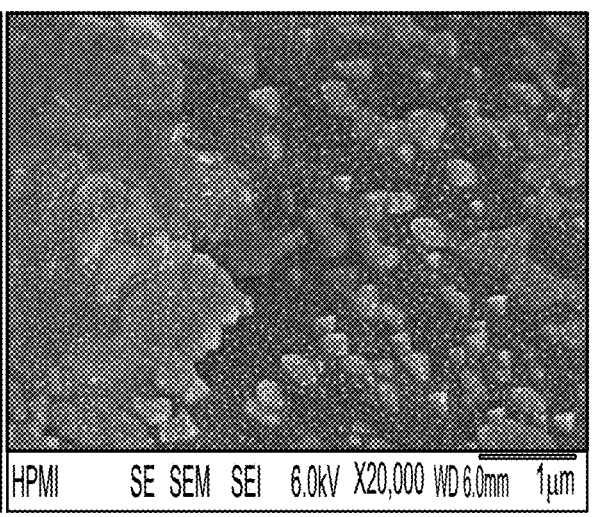
FIG. 5E　　　　　　　　　FIG. 5F

WIRE-SHAPED PEROVSKITE STRUCTURES AND METHODS FOR MANUFACTURE THEREOF

CROSS-REFERENCE TO RELATED APPLICATIONS

This application claims priority to and benefit of U.S. Provisional Application No. 62/794,285, filed Jan. 18, 2019, which is incorporated herein by reference.

BACKGROUND

Semi-conducting behavior has been observed for over a century and a half, with the first integration of the pn junction photodetector attributed to Weckler in 1965 [1, 2]. Since then, photodetectors have been fabricated with a variety of materials including GaN, ZnO, Si, InGaAs, quantum dots, carbon nanotubes, and polymers [1, 3-8]. More recently, perovskites, in particular organolead triiodide perovskite ($CH_3NH_3PbI_3$), have been used as an absorber material for solar cells and photodetectors since this material exhibits similar performance to earlier materials but with a lower production cost, and rapid increase in power conversion efficiency (PCE). [9, 10]. For example, planar perovskite devices have been produced using doctor-blade [21, 22], spray [23, 24], and spin coating [25-28] methods. However, these perovskite solar cells and photodetectors are planar-shaped devices, which shapes have limited utility in some applications.

Wire-shaped photovoltaic devices have been developed, such as those that use ZnO as the light absorbing material, but suffer from significantly poorer performance than that of flat substrate devices. [11-15]. For example, ZnO based photodetectors are limited only to the UV region with the best results showing 0.9 A/W responsivity and 0.28/5.3 second rise/decay time.

Accordingly, improved wire-shaped perovskite devices and methods of making them are needed.

BRIEF SUMMARY

In one aspect, devices are provided that include a wire-shaped semi-conductor substrate; and a perovskite coating on an outer surface of the wire-shaped semi-conductor substrate. The wire-shaped semi-conductor substrate may be or include a carbon nanotube yarn or a rope formed of twists of carbon nanotube yarns. The perovskite coating is crystalline with preferential grain growth at (110) plane, and it preferably is substantially uniform in thickness both in the axial direction of the substrate and in the radial direction of the substrate. In some preferred embodiments, the perovskite coating comprises crystal sizes greater than 0.75 microns.

In some embodiments, the device is a flexible, wire-shaped photodetector which includes a flexible wire-shaped semi-conductor substrate, and a crystalline perovskite coating annealed onto an outer surface of the wire-shaped semi-conductor surface. The perovskite coating may include $CH_3NH_3PbI_3$.

In another aspect, a method of making a wire-shaped perovskite device is provided. In some embodiments, the method includes (i) depositing a perovskite solution onto an outer surface of a wire-shaped semi-conductor substrate; and then (ii) annealing the deposited perovskite solution by Joule heating to produce a perovskite coating on the wire-shaped semi-conductor substrate; and optionally, (iii) repeating said depositing and annealing in order to build successive layers of the perovskite coating on the wire-shaped semi-conductor substrate. The annealing by Joule heating may include connecting an indium gallium top electrode to the wire-shaped semi-conductor substrate. The perovskite solution may be a $CH_3NH_3I:PbI_2$ solution. In some preferred embodiments, the method enables the production of a flexible, wire-shaped photodetector having a perovskite coating that is substantially uniform in thickness both in the axial direction of its wire-shaped substrate and in the radial direction of the substrate. The method enables the perovskite coating to have crystal sizes greater than 0.75 microns.

BRIEF DESCRIPTION OF THE DRAWINGS

FIGS. 5A, 5C, and 5E are scanning electron microscope (SEM) images of a $MAPbI_3$ coated CNY using Joule heating at various magnifications, according to some embodiments of the present disclosure.

FIGS. 5B, 5D, and 5F are SEM images of a $MAPbI_3$ coated CNY using a hot plate annealing method at various magnifications, according to some embodiments of the present disclosure.

DETAILED DESCRIPTION

Figure 1A:
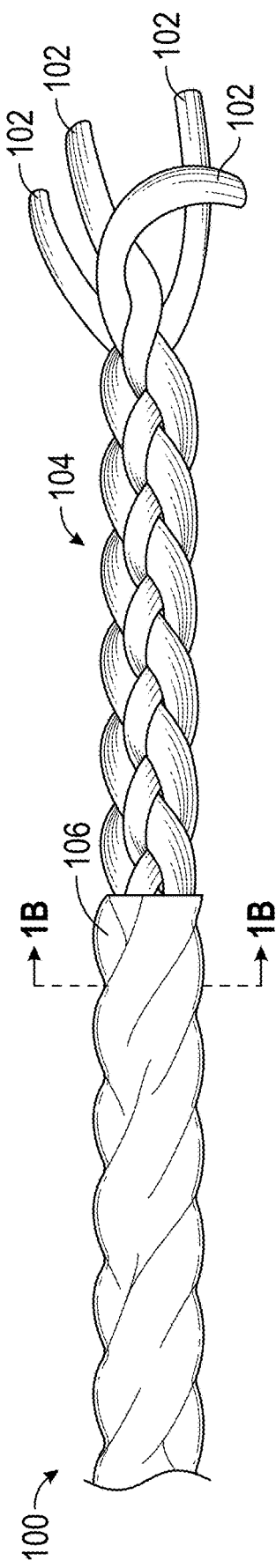
FIG. 1A illustrates a wire-shaped perovskite device, according to one embodiment of the present disclosure.

Methods have been developed for producing a uniform layer thickness of perovskite material on wire-shaped substrates of a semi-conductor material. The semi-conductor material may be a carbon nanotube (CNT) material, such as a CNT yarn or a rope of CNT yarns. The method includes an electro-coating process, preferably for example including Joule heating, which advantageously allows the manufacturer to predictably and repeatably coat wire-shaped semi-conductive material substrates. Using this method, a flexible wire shaped perovskite photodetector advantageously can be produced.

In one embodiment of a method for making a wire-shaped perovskite device, the method includes coating a carbon nanotube rope in a perovskite solution and then annealing the perovskite solution onto the carbon nanotube rope by Joule heating. The perovskite solution includes one or more perovskite materials dissolved or dispersed in a suitable solvent as known in the art. The annealing step includes evaporation of the solvent. The use of Joule heating enables one to uniformly control the substrate temperature, and thereby advantageously enables one to create pristine crystalline films of perovskite, particularly thin and uniform films to form on wire-shaped carbon substrates, such as ones consisting of carbon nanotube yarns and ropes.

In another aspect, a wire-shaped perovskite device is provided. In some embodiments, the device includes a carbon nanotube rope having an annealed perovskite coating, which advantageously may have a selected, uniform thickness along the length of the carbon nanotube rope. In some embodiments, the carbon nanotube rope contains at least 4 twisted carbon nanotube yarns (CNYs).

In some preferred embodiments, a flexible wire shaped perovskite photodetector is make using a joule heating method as described herein. By uniformly controlling the substrate temperature, one is able to create pristine crystalline films of perovskite on CNY wires. In one example, detailed below, the perovskite ($MAPbI_3$) photodetector prepared by a single step method showed strong responsivity (10.2 A/W), detectivity (1.76×1011 J), and Ilight/Idark (45) with 0 V bias. This wire device shows great promise for implementation into composite structures. It was found that uniform heat is necessary for the crystallization of the absorber layer on the CNY substrate. When a constant temperature is applied across the substrate region, evaporation of the solvent occurs evenly, allowing for a thin and uniform film to form over the CNY. This enables one to apply more advanced perovskite solution chemistries with this technique in order to minimize the performance gap between flat and wire-shaped perovskite photovoltaic devices.

In some embodiments, the device is flexible, e.g., elastically deformable. This may be advantageous in a variety of applications.

In some embodiments, the device is part of an LED, a solar cell, or a photodetector. In some embodiments, a carbon-based, flexible, wire-shaped perovskite photodetector is provided. In some embodiments, this flexible wire-shaped perovskite photodetector performs exceedingly well under low light environments (11 A/W) and is easily woven into composites due to its flexibility and small diameter. For example, in some embodiments the device has a diameter of about 400 or from about 300 μm to about 500 for example about 300 about 350 about 400 about 450 about 500 or any ranges therebetween.

In some embodiments, the wire-shaped perovskite device is embedded in a composite. For example, the wire-shaped perovskite device may be embedded in a composite for structural health monitoring, e.g., using light emissions at 585 nm and 617 nm. [16-18].

However, wire-shaped cell fabrication has less developed solutions [19, 29]; and does not benefit from the history of extensive research found for planar thin film cells. It has been shown that methyl ammonium lead iodide perovskite ($MAPbI_3$) necessitates alternative processing such as two-step deposition or solvent engineering methods to create a pin-hole free, continuous thin film adding additional complexity in the fabrication process [30, 31]. However, using $MAPbI_3$ we have created a continuous thin film on a wire using the joule heating method that shows comparable electrical characteristics to planar rigid perovskite photodetectors.

Without intending to be bound by any particular theory, it is believed that joule heating uniformly controls the temperature of the carbon nanotube rope substrate, which allows the method to produce a uniform coating having improved properties.

Equation 1 below shows how Joule heating, also known as ohmic or resistive heating, directly converts electric energy to heat (meaning that every joule of electrical energy supplied produces one joule of heat). Without intending to be bound by any particular theory, it is believed that this allows for rapid heating or cooling of the substrate, giving a high degree of control to the user.

$$Q = I^2 R t \qquad \text{EQ 1}$$

where Q is heat (joules), I is current (amps), R is resistance (ohms), and t is time (seconds), with DC power supply.

FIG. 1A illustrates a wire-shaped perovskite device 100 including four carbon nanotube yarns 102 that are wound into a carbon nanotube yarn rope 104. A perovskite crystalline thin film 106 is annealed onto the carbon nanotube yarn rope 104. Although four carbon nanotube yarns 102 are depicted, it is understood that more than four carbon nanotube yarns could be wound together into carbon nanotube yarn rope 104, such as five carbon nanotube yarns, six carbon nanotube yarns, or more than six carbon nanotube yarns.

Figure 1B:
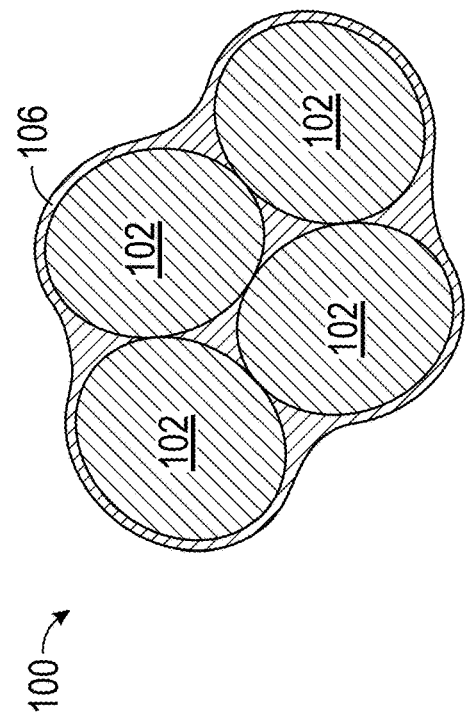
FIG. 1B illustrates a cross-sectional view of the device in FIG. 1A, taken along the line 1B-1B, according to one embodiment of the present disclosure.

FIG. 1B illustrates a cross-sectional view of the wire-shaped perovskite device 100 taken along line 1B-1B, including four carbon nanotube yarns 102 that are wound into the carbon nanotube yarn rope 104. The perovskite crystalline thin film 106 is annealed onto the carbon nanotube yarn rope 104. Although the cross-section of the carbon nanotube yarns is depicted as having an oval shape due to the nature of braided rope, the cross-sectional shape of the carbon nanotube yarns is largely immaterial.

Figure 2A:
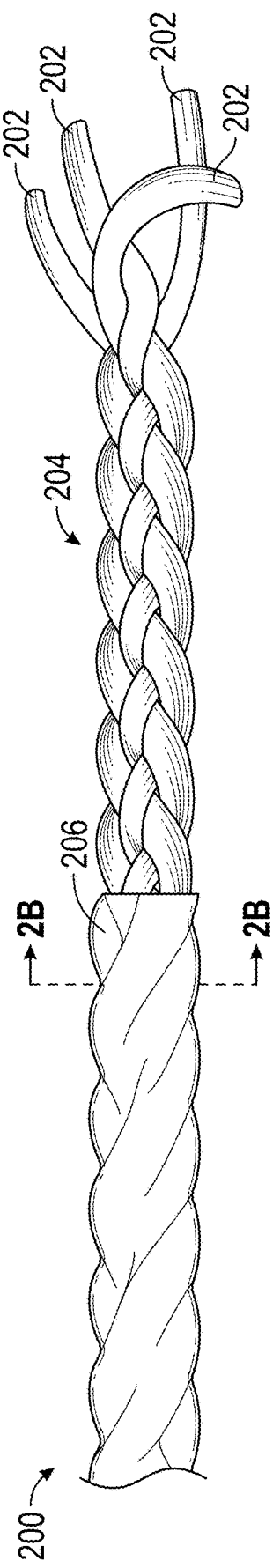
FIG. 2A illustrates a wire-shaped perovskite device, according to one embodiment of the present disclosure.

FIG. 2A illustrates a wire-shaped perovskite device 200 including four carbon nanotube yarns 202 that are wound into a carbon nanotube yarn rope 204. A perovskite crystalline thin film 206 is annealed onto the carbon nanotube yarn rope 204. Although four carbon nanotube yarns 202 are depicted, it is to be understood that more than four carbon nanotube yarns could be wound together into carbon nanotube yarn rope 204, such as five carbon nanotube yarns, six carbon nanotube yarns, or more than six carbon nanotube yarns.

Figure 2B:
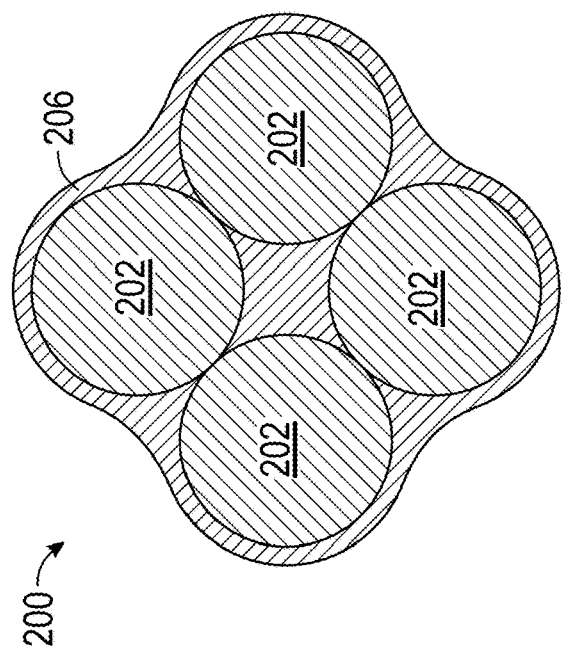
FIG. 2B illustrates a cross-sectional view of the device in FIG. 2A, taken along the line 2B-2B, according to one embodiment of the present disclosure.

FIG. 2B illustrates a cross-sectional view of the wire-shaped perovskite device 200 taken along line 2B-2B, including four carbon nanotube yarns 202 that are wound into the carbon nanotube yarn rope 204. The perovskite crystalline thin film 206 is annealed onto the carbon nanotube yarn rope 204. Although the cross-section of the carbon nanotube yarns is depicted as having a simplified circular shape, the cross-sectional shape of the carbon nanotube yarns is immaterial.

The methods and devices described herein can be further understood with the following non-limiting examples.

Example 1: Method of Making a Photodetector

First, a perovskite layer was prepared using a single step deposition method. Methylammonium iodide ($CH_3NH_3I$; Sigma Aldrich) was weighed out to 113 mg (710 μM). Next 710 μL of gamma-butyrolactone (GBL; Sigma Aldrich) was added to the $CH_3NH_3I$ and stirred for 5 min at 50° C. in order to create a 1:1 molar ratio solution. Next, 187 mg of lead iodide ($PbI_2$; Sigma Aldrich) was weighed out in a separate container. The $CH_3NH_3I$/GBL solution was added to the $PbI_2$ powder and stirred at 65° C. for 40 min to create a 1.75M:1M ($CH_3NH_3I:PbI_2$) perovskite solution.

A carbon nanotube yarn (CNY) was used as substrate and electron transport layer to prepare perovskite based wire shaped photodetector using the solution described above. The CNY was comprised of rope spun of 4 individual carbon nanotube yarn strands which provided sufficient mechanical stability, and the CNY was approximately 400 μm in diameter. A custom rope winding mechanism was used to create CNY rope. In this mechanism, pitch is defined by a counter which is connected to the geared mechanism. Without intending to be bound by any particular theory, it is believed when making the CNY, it is critical that the strands hold together during handling and coating, and it is believed that 4 CNY strands was the minimum amount to achieve this.

Next, the perovskite solution was deposited on the CNY, with indium gallium (Alfa Aesar) as the top electrode. Although gold and silver are often common electrode choices, the indium gallium proved to provide the most consistent contact on the curved surface, while still having a closely matched work function to that of silver [32].

Figure 4A:
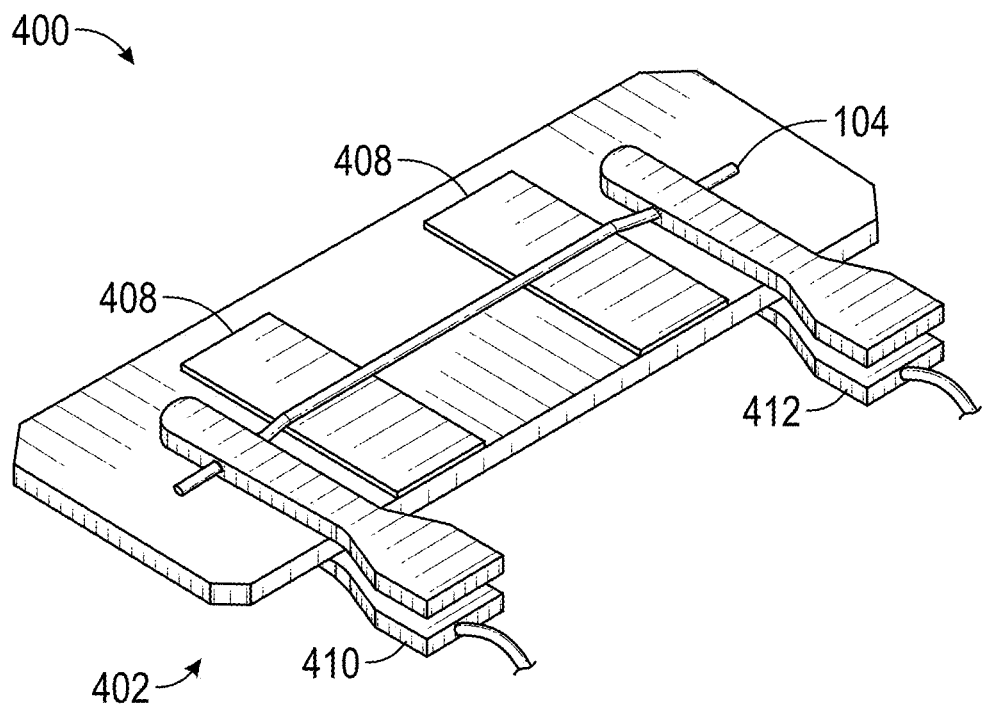
FIG. 4A illustrates a single CNY rope mounted to a power source for joule heating application, according to one embodiment of the present disclosure.
Figure 4B:
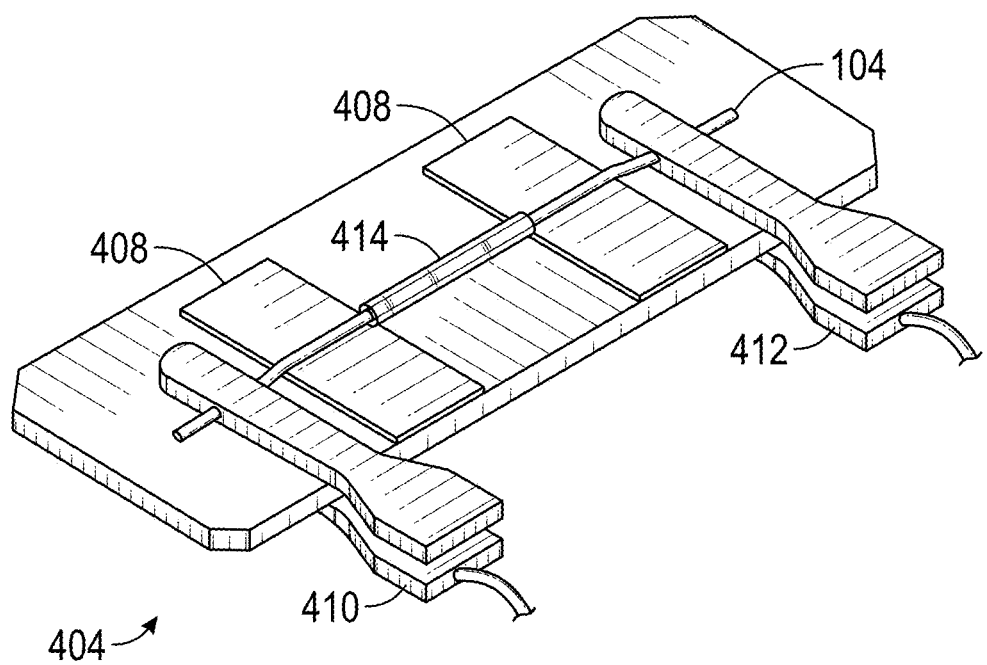
FIG. 4B illustrates a perovskite solution deposited on the CNY substrate for annealing, according to one embodiment of the present disclosure.
Figure 4C:
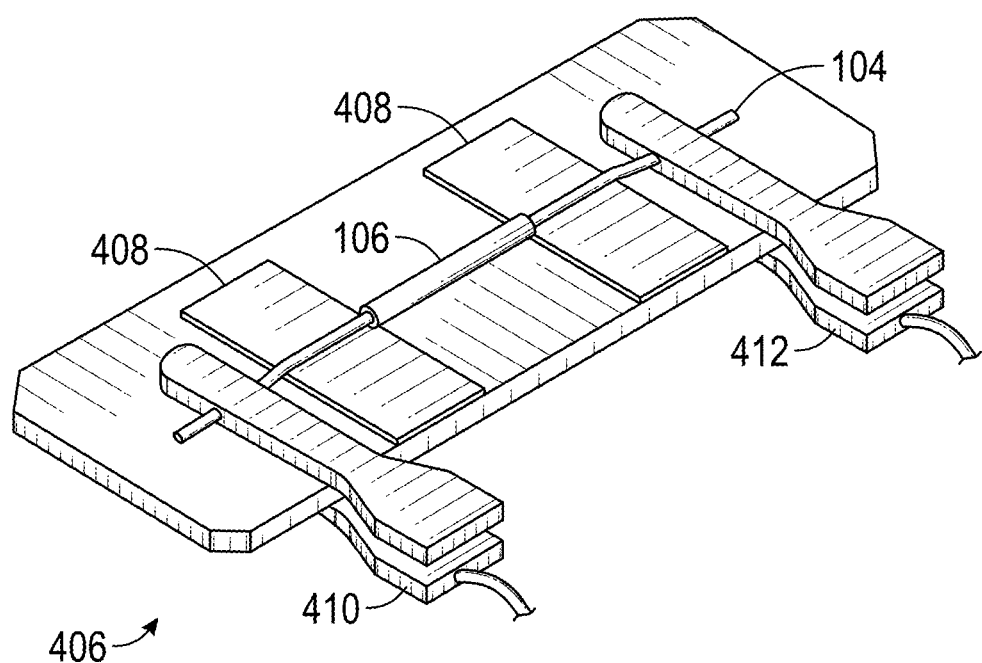
FIG. 4C illustrates annealing yields perovskite crystalline thin film around the body of the CNY device, according to one embodiment of the present disclosure.

FIGS. 4A-4C illustrate the fabrication method 400 used to create a wire-shaped photodetector using joule heating. FIG. 4A illustrates step 402, where a single CNY rope 104 is mounted on glass slides 408 and connected to a power source including top electrode 410 and bottom electrode 412. FIG. 4B illustrates step 404, where perovskite solution 414 is deposited on the CNY rope 104. FIG. 4C illustrates step 406, where perovskite solution 414 is annealed yielding perovskite crystalline thin film 106. Although a single CNY rope is depicted as being mounted and annealed, more than one CNY rope could be mounted and annealed in steps 402, 404, and 406 such as two CNY ropes, three CNY ropes, or more than three CNY ropes.

One of the most important features of the CNY threads/wires is their high curvature axial symmetric shape compared to planar substrate. However, due to this high curvature, it is challenging to control the film uniformity during perovskite layer deposition on CNY along both radial and axial directions. The CNY was placed on a glass slide and connected to a power source for joule heating. In order to ensure complete coverage of perovskite material a slide was designed to raise the CNY up off the glass surface during the annealing process. The quality and thickness of the perovskite film was found to depend on heating current, quantity of the perovskite solution and number of coating times. The heating current was optimized at 0.6 A using 30 μL of perovskite solution with three consecutive coating processes to achieve the best film quality, such as adhesion, uniformity and thickness of the film.

Example 2: Characterization of Materials

The crystalline structure of the photodetector of Example 1 was characterized by powder X-Ray Diffraction (XRD). Steady-state emission data were collected at room temperature using an Edinburgh FLS980 spectrometer. Samples were excited by light output from a housed 450 W Xe lamp passing through a single grating (1800 l/mm, 250 nm blaze) Czerny-Turner monochromator, and finally a 5 nm bandwidth slit. Emission from the sample was passed through a 570 nm long pass filter, a single grating (1800 l/mm, 500 nm blaze) Czerny-Turner monochromator (21 nm bandwidth), and thus detected by a Peltier-cooled Hamamatsu R928 photomultiplier tube. SEM images were taken by a high resolution field emission scanning electron microscope (FE-SEM), JEOL 7401F). The I-V (current-voltage) and I-t (current-time) measurements of the flexible wire shaped photodetector were obtained by a Keithley 2400 integrated with Labview. The perovskite photodetectors were tested using white light, 585 nm and 617 nm LED.

With this new manufacturing technique and using only single step deposition, crystalline perovskite films were produced that were comparable to that of flat perovskite photodetector devices [33, 34]. FIGS. 5A-5F show the SEM results of two types of devices that were fabricated: joule heating (JH) (FIGS. 5A, 5C and 5E) as in Example 1 and hot plate (FIGS. 5B, 5D and 5F) as the heating source for perovskite annealing as a control sample. FIG. 5A shows uniform and compact dense formation of perovskite crystal with size ranging from 0.75 to >2 μm (FIG. 5C) by joule heating method. However, non-uniformity, cracks, and some voids were obtained in the perovskite layer prepared using the hot plate method. Although there are large crystalline surfaces (FIG. 5B), it can be seen, that there are large pockets where crystal size drops to <100 nm as well as discontinuity of the grains of perovskite. Without intending to be bound by any particular theory, it is believed that this is due to the non-uniform distribution of heat applied to the substrate during the annealing process which causes unequal solvent evaporation across the substrate.

It was also observed that the diameter of perovskite layer prepared by hot plate method is greater than the diameter of perovskite layer prepared by joule heating method for the same volume of perovskite solution. This results in poor surface coverage and uncontrolled morphological variations in samples prepared using a hot plate method, as shown by SEM images (FIGS. 5B, 5D, and 5F). Therefore, the joule heating technique was used to gain a better control of crystal formation and growth mechanism of perovskite crystal on carbon nanotube yarn. The Joule heating method provides the uniform temperature throughout the CNY wire for the deposition of the perovskite solution compared to non-uniform temperature obtained through hot plate method. Without intending to be bound by any particular theory, it is believed that the uniformity of temperature in case of joule heating technique is due to direct conversion of electrical energy in to heat energy applied uniformly on CNY as discussed in Equation 1 above.

Figure 3:
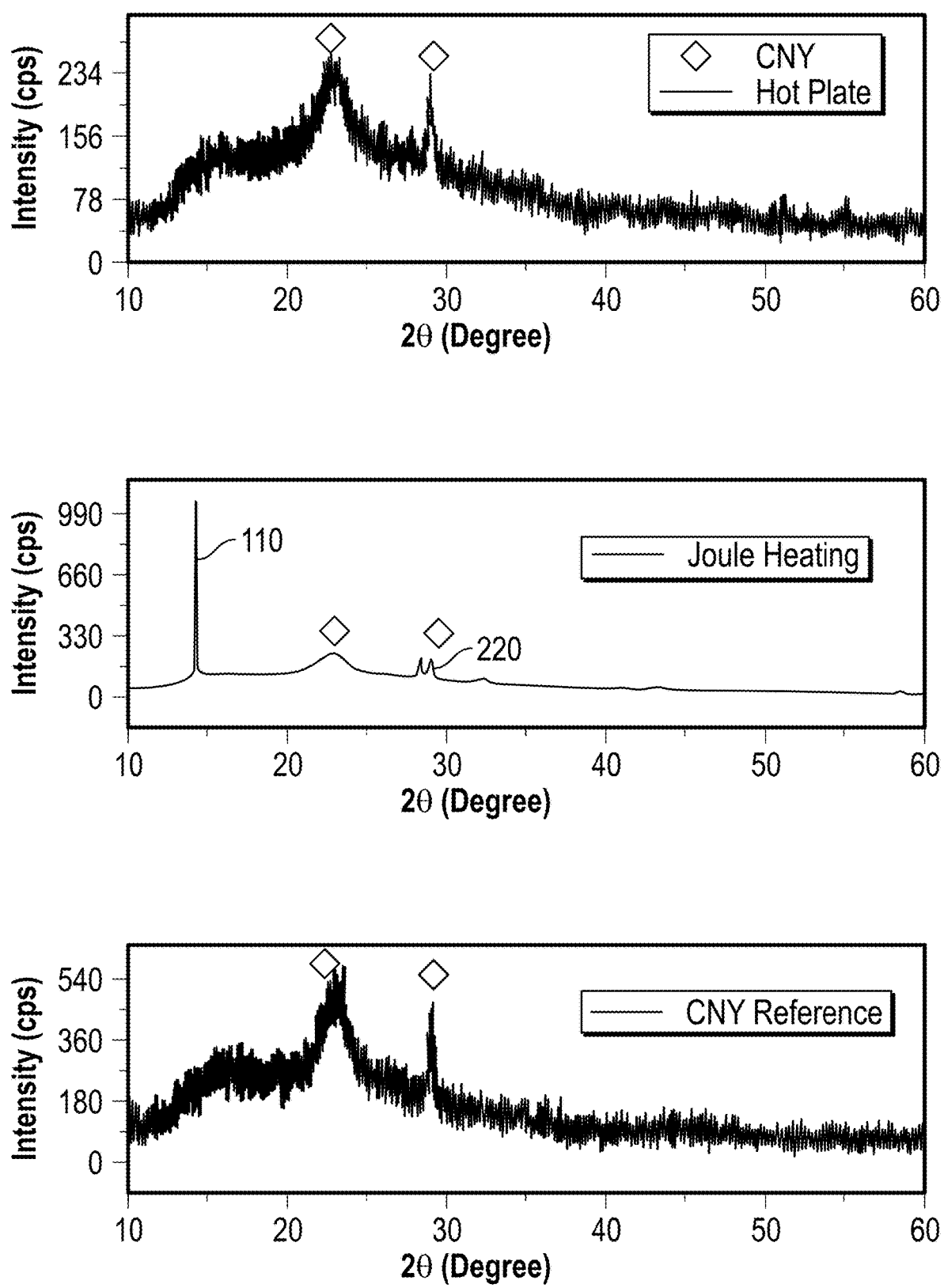
FIG. 3 illustrates X-ray Diffraction (XRD) spectra of $MAPbI_3$ coated carbon nanotube yarn (CNY) using Joule heating and hot plate annealing methods, according to some embodiments of the present disclosure.

The perovskite crystal structure can be described by the general formula $MAX_3$, where M and A are cations and X is an anion. The perovskite crystal structure used for the preparation of wire shaped photodetectors was $CH_3NH_3PbI_3$, where $M=CH_3NH_3$, A=Pb and X=I. These crystals are held together by ionic bond between organic and inorganic counterparts and by hydrogen bond [35, 36]. XRD patterns were recorded to understand the crystallization of perovskite layer on CNY prepared by joule heating and hot plate annealing method. FIG. 3 shows the XRD patterns of $MAPbI_3$ coated CNY using Joule and hot plate annealing method. The strong Bragg peaks at 14.08° and 28.41° are assigned to (110) and (220) plane of $CH_3NH_3PbI_3$ prepared by joule heating method. These structures correspond to tetragonal I4 cm crystal structure of methyl ammonium lead halide perovskite with high crystallinity [37, 38]. Without intending to be bound by any particular theory, it is believed that a peak at 12.12° corresponding to (001) of $PbI_2$, has been suppressed due to scattering of light by three dimensional thread-like CNY substrate due to its low signal to noise ratio (SNR). This $PbI_2$ phase has been widely reported in the past using different deposition methods [38-41]. The (110) peak of perovskite phase was highest for samples prepared by joule heating method. This shows that joule heating method results in complete crystallization of perovskite films with preferential grain growth at (110) plane.

Without intending to be bound by any particular theory, it is believed that the joule heating method results in fast crystallization of perovskite layer with rapid solvent evaporation due to localized uniform heating on the CNY wire. The CNY wire was comprised of rope spun of 4 individual carbon nanotube yarn strands with total diameter of 400 The dynamics of crystal growth on CNY is due to the combined effect of temperature and its surface. The surface temperature of the substrate during the film formation affects the degree of surface induced nucleation because the nucleation events increases with high and uniform temperature throughout the surface [42]. The surface roughness and inhomogeneity of the CNY wire allow lower energy pathways for nucleation of the crystallite sites, thus increasing the crystallinity of the perovskite layer on CNY by overcoming the energy barrier for nucleation [43]. Therefore, without intending to be bound by any particular theory, it is believed that the perovskite film prepared by joule heating method leads to faster nucleation, higher crystallinity, and compact and uniform morphology (see FIGS. 5A, 5C, 5E). The perovskite samples prepared by hot plate method did not show detectable (110) phase of perovskite as shown in FIGS. 5B, 5D, 5F. This may be due to very low intensity from (110) plane where the signal from background CNY dominates.

Figure 6:
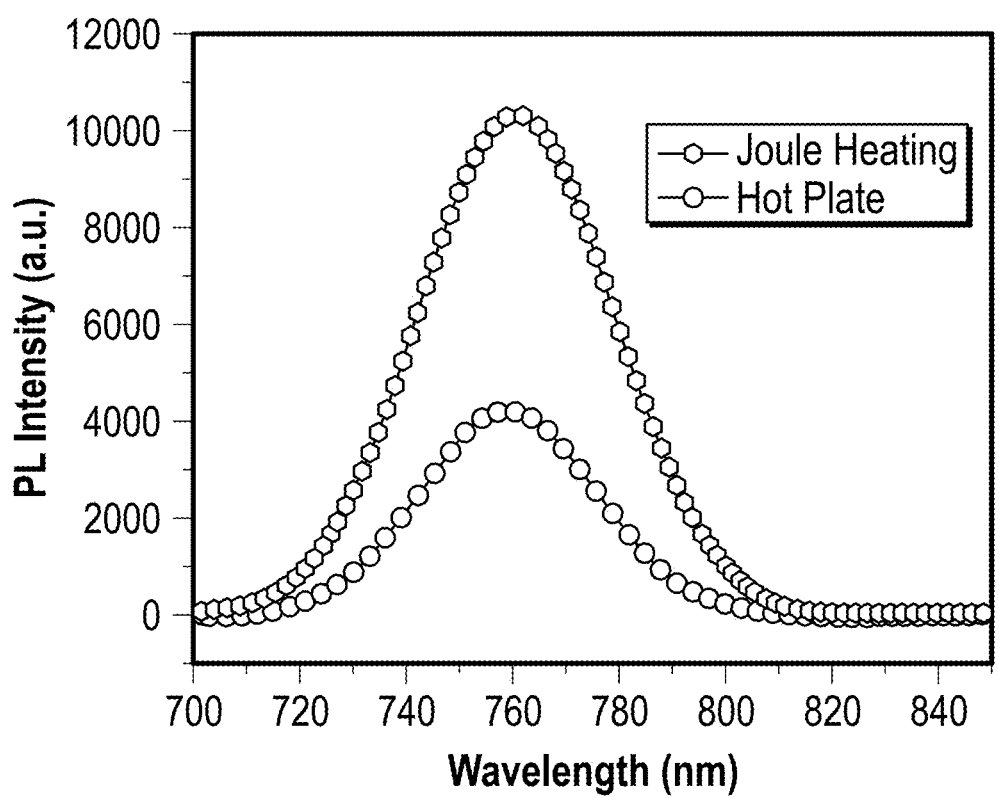
FIG. 6 illustrates photoluminescence spectroscopy of $MAPbI_3$ coated CNY using Joule heating and hot plate annealing methods, according to some embodiments of the present disclosure.

As shown in FIG. 6, the photoluminescence (PL) spectra of perovskite coated on CNY with joule heating method have a high PL intensity at 760 nm compared to perovskite coated on CNY using hot plate [44]. The PL was obtained by exciting the samples by 488 nm light output from a housed 450 W Xe lamp. In order to quantify and compare the PL of the perovskite layer prepared by joule heating and hot plate method, we have calculated the PL efficiency defined as $\rho=I/(P \cdot a)$ [45], where I is the integrated intensity of the PL spectrum, P is the power of the excitation light, and a is the absorption factor at the excitation wavelength (488 nm). The PL efficiency of the perovskite photodetector prepared by joule heating method is ~2.5 times higher than the PL efficiency of the perovskite photodetector prepared by hot plate method [45]. It has been reported that the PL emission depends upon the morphologies, crystallinity, grain sizes and defects [46] in the perovskite film. The PL intensity is high for the perovskite film with large grain size, higher crystallinity and possesses better optical quality [47]. The PL spectroscopy shown in FIG. 6 is consistent with the microscopic morphologies and XRD spectroscopy (See FIG. 3), which shows largest grain size and highest crystallinity for perovskite layer prepared by joule heating method. Without intending to be bound by any particular theory, it is believed that the decrease in PL intensity for the hot plate annealed perovskite film can be attributed to higher number of grain boundary area due to small grain sizes (See FIGS. 5A-5F). It was found that the grain boundary acts as strong PL quenching site due to non-radiative trap centers [47, 48]. The origin of these non-radiative trap centers may be due to the chemical inhomogeneity, presence of defects and dangling bonds [49]. It has been reported that the origin of defects and dangling bonds in perovskite film are due to the exposed iodine atoms in the perovskite films [41].

Example 3: Device Characterization

Next, the photodetector of Example 1 was tested as described below. As can be seen from these results, the performance of the wire shaped perovskite photodetector on CNY critically depends upon the surface geometry and annealing conditions. The use of the joule heating method for uniform control of temperature on CNY surface resulted in smooth perovskite crystalline phase, and produced a self-powering photodetectors (PDs) with strong responsivity (10.2 A/W), detectivity (1.76×1011 J), and $I_{light}/I_{dark}$ (45). This development displays the role of joule heating in the annealing process, and demonstrates an inexpensive, repeatable method for the fabrication of self-powered perovskite PDs on high curvature surfaces.

In applications such as embedded sensing [50], any need for external power adds to both the complexity and cost of the photodetector's implementation. Therefore the device's performance under 0 bias voltage is paramount. The flexible wire shaped photodetector prepared in this study made use of asymmetrical electrodes to create the built-in potential without any external bias able to overcome the binding energy of photo generated electron-hole pairs [11, 51]. Hybrid perovskite photodetectors have shown very low noise current ($I_n$) making them a good choice for highly sensitive applications; however, these perovskite photodetector devices are cited to perform best when paired with hole blocking layers such as poly[(9,9-bis(30-(N,N-dimethylamino)propyl)-2,7-fluorene)-alt-2,7-(9,9-dioctylfluorene)] (PFN) [28]. Due to the pristine crystalline quality, the joule heating samples showed consistent $I_n$ values at 100 pA. This was a huge performance step gained from a technical fabrication technique, which eliminates the need for further deposition steps and chemicals, minimizing complexity, time, and cost.

Figure 7A:
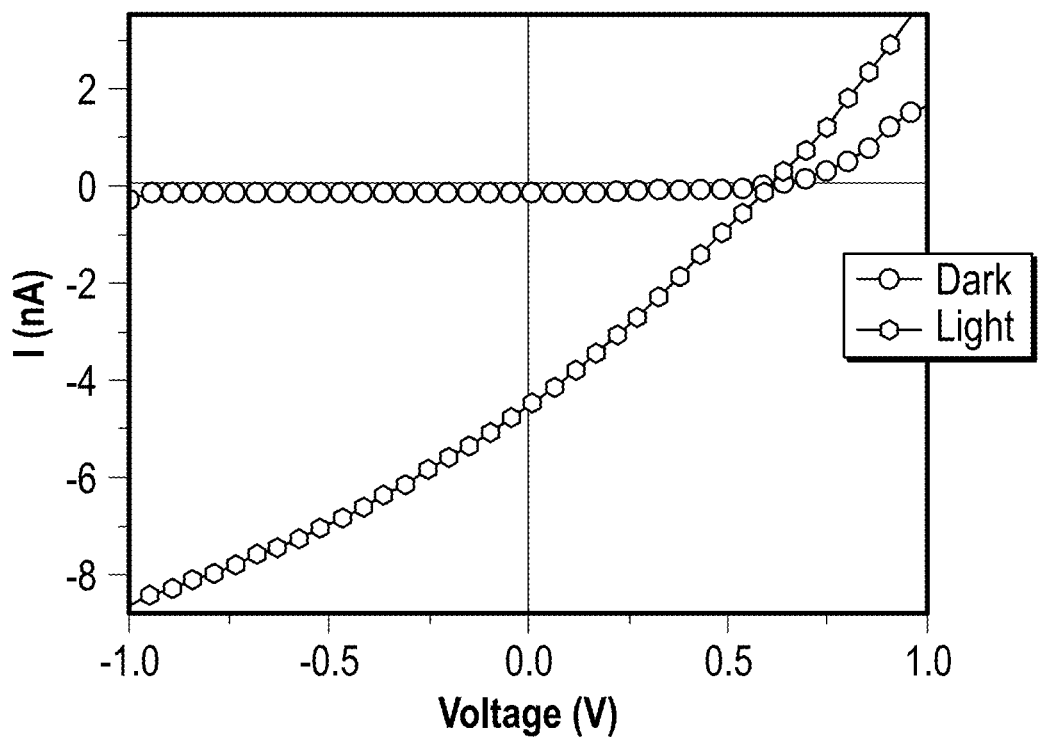
FIG. 7A illustrates light and dark IV curve of a wire shaped perovskite photodetector with 0 bias, according to one embodiment of the present disclosure.
Figure 7B:
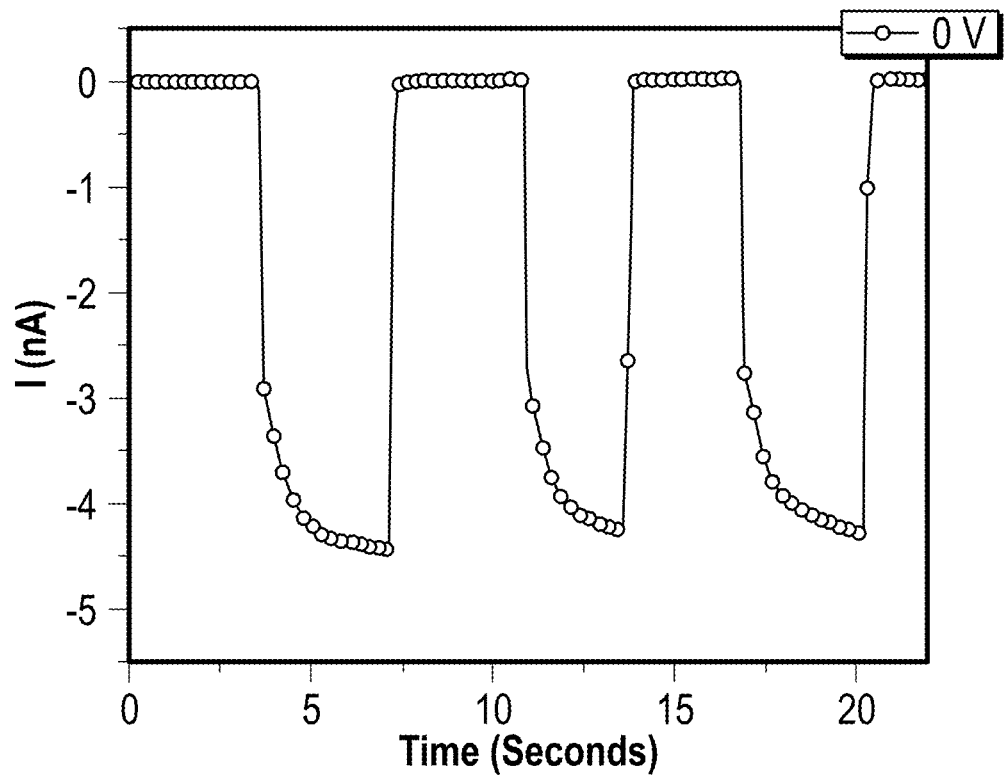
FIG. 7B illustrates time-dependent photocurrent of wire shaped perovskite photodetector under 88 $W/m^2$ white light for 0 bias, according to one embodiment of the present disclosure.
Figure 7C:
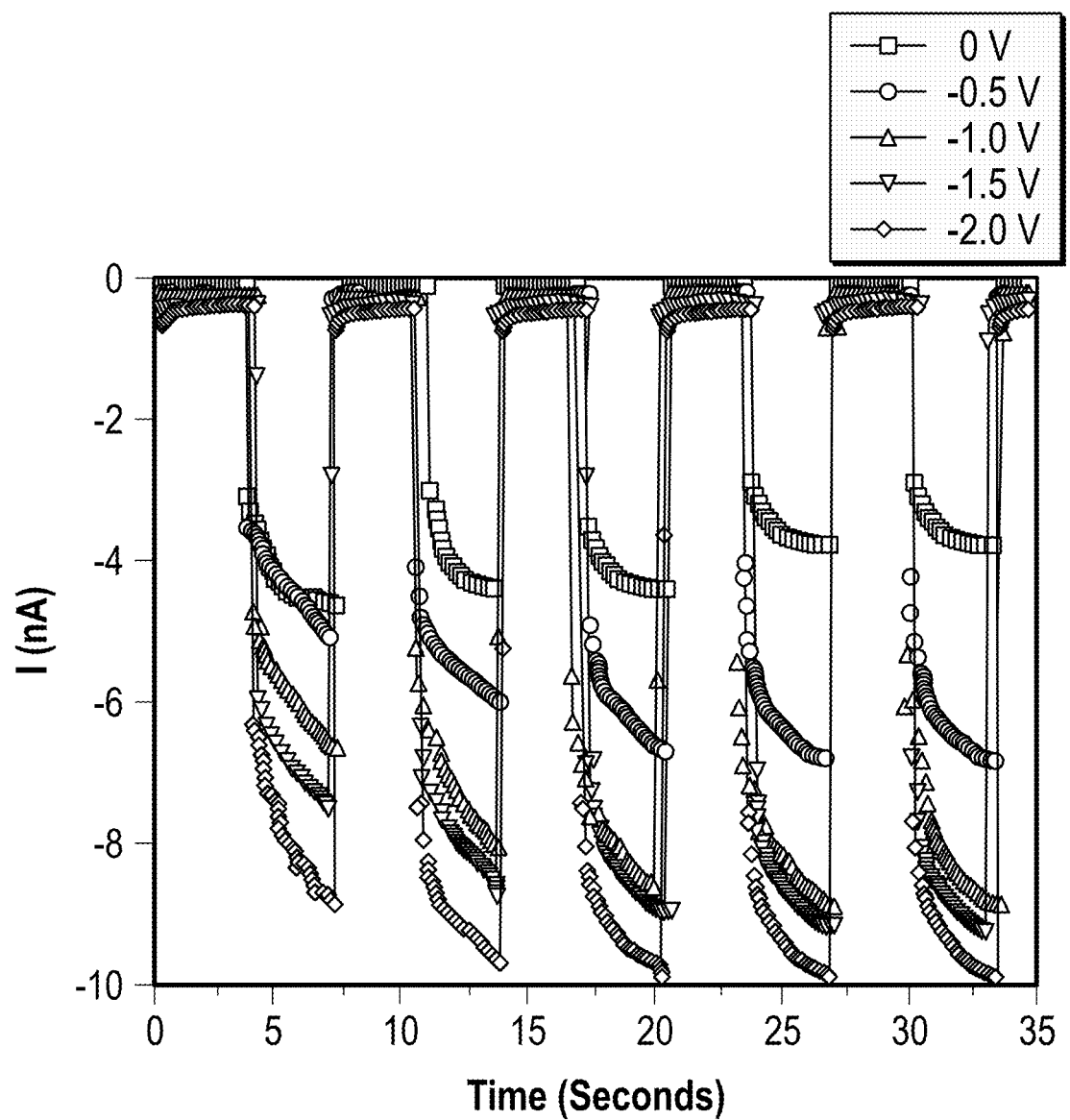
FIG. 7C illustrates the time-dependent photocurrent of wire shaped perovskite photodetector under 88 $W/m^2$ white light for varying bias voltages, according to one embodiment of the present disclosure.

FIG. 7A shows the IV curves of perovskite photodetector at light and dark conditions. The IV curve shows a non-linear relationship with the applied bias voltage. The light current was found to be 45 times the dark current (FIG. 7A), which contributes to a high signal-to-noise ratio (SNR) of photodetector partly due to the large amount of light current. The IV curve of the wire shaped photodetector (FIG. 7A) shows significant amount of current (~4.5 nA) without applying any external bias and are reproducible as shown in a time dependent photocurrent response (FIG. 7B). The photocurrent response was seen to increase with increasing the bias voltage as shown in FIG. 7C. The photocurrent increases more than two times by increasing the voltage level to 2V compared to a perovskite photodetector device without any external bias voltage. Therefore, the prepared flexible wire shaped detector are suitable for self-power and low power applications. The properties of our photodetector to produce a measurable amount of current at zero bias is due to (a) asymmetric work function of the electrodes and (b) changes in the band offsets between CNY/perovskite/In/Ag due to self-passivation of the perovskite layer due to small amount of lead iodide. The work function of CNY and In/Ag is ~−4.2 eV [32] and ~−4.3 eV [52], and the highest occupied molecular orbital (HOMO) and lowest unoccupied molecular orbital (LUMO) level of perovskite is ~−5.43 eV and ~−3.93 eV [9]. The formation of the depletion width between CNY and perovskite gives rise to built-in electric field ($E_b$~0.87 eV) from CNY to perovskite, which overcomes the potential barrier and allows the electrons to flow from perovskite to CNY.

Figure 7D:
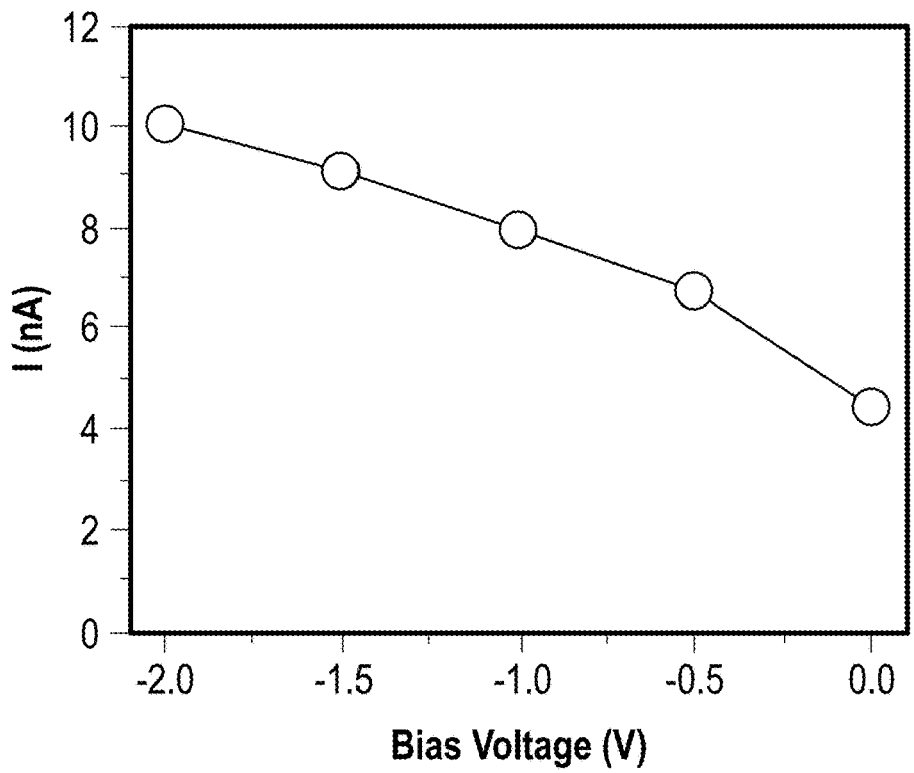
FIG. 7D illustrates the effect of bias voltage on the photocurrent response of a wire shaped perovskite photodetector, according to one embodiment of the present disclosure.
Figure 8:
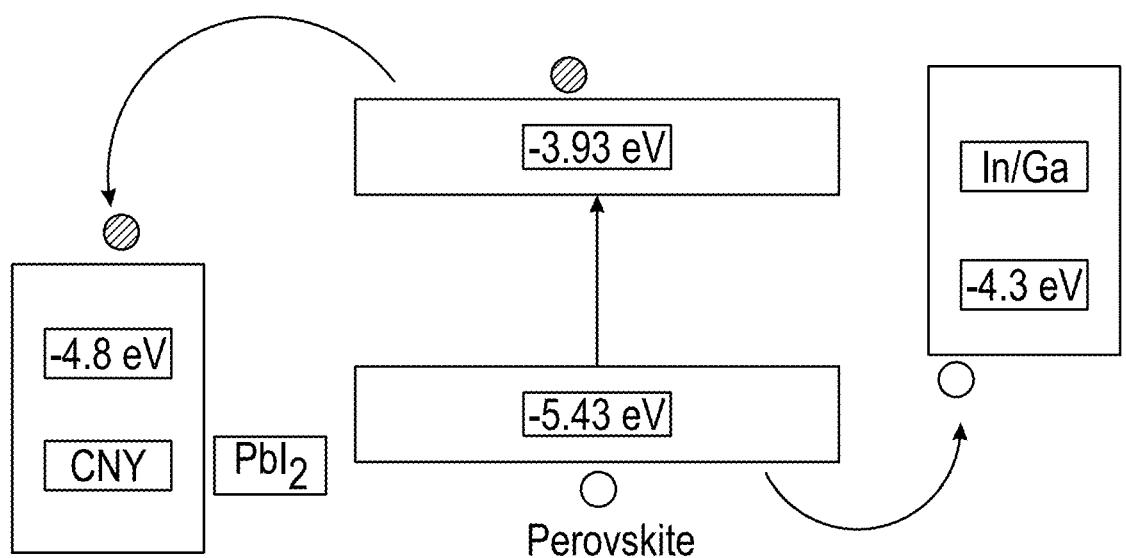
FIG. 8 is an energy band diagram of wire-shaped perovskite photodetector, according to one embodiment of the present disclosure.

Without intending to be bound by any particular theory, it is believed that when the device is illuminated, the electrons are promoted to the conduction band in the perovskite, leading to generation of electron-hole pairs which drift to either electrode due to formation of built in electric field near their respective contacts as shown in FIG. 8. In addition to this process, the perovskite layer formed by single step deposition method leads to the formation of small amount of lead iodide during the fabrication process. The valence band of lead iodide lies below the HOMO level of perovskite [41] and partially acts to block the holes being recombined with electrons from the CNY suppressing the back recombination of the electron-hole pairs [41, 53]. Therefore, the formation of small amount of lead iodide at CNY/perovskite junction changes the local charge carrier density at the interface, and enhances the illuminated current at zero bias conditions. The photodetectors were also tested increasing the bias voltage. As bias voltage was linearly changed, a near linear response was obtained from the device as shown in FIG. 7D where both the photocurrent and dark current increased predictably. This is due to the change in junction capacitance which decreases allowing for larger current to flow from the device as voltage bias is increased.

Responsivity, the measure of electrical output per watt of incident radiant power is here described by Equation 2 [28], where R is responsivity, 11 is external quantum efficiency, q is charge, f is the frequency of the optical signal, and h is Planck's constant.

$$R = \eta \frac{q}{hf} = \frac{J_{ph}}{L_{light}}$$ EQ. 1

Detectivity (D*) of the photodetector describes the signal over noise given the incident light. Detectivity is calculated by the responsivity (R) divided by the square root of the dark current density ($J_{dark}$). It is critical to suppress dark current as it plays a vital role in the device's ability to sense low light levels. In order to minimize dark current, the light absorbing film must be in pristine condition, minimizing pinholes and trap states within the crystalline structure [28].

$$D^* = \frac{J_{ph}/L_{light}}{\sqrt{2qJ_{dark}}}$$ EQ. 2

Figure 7E:
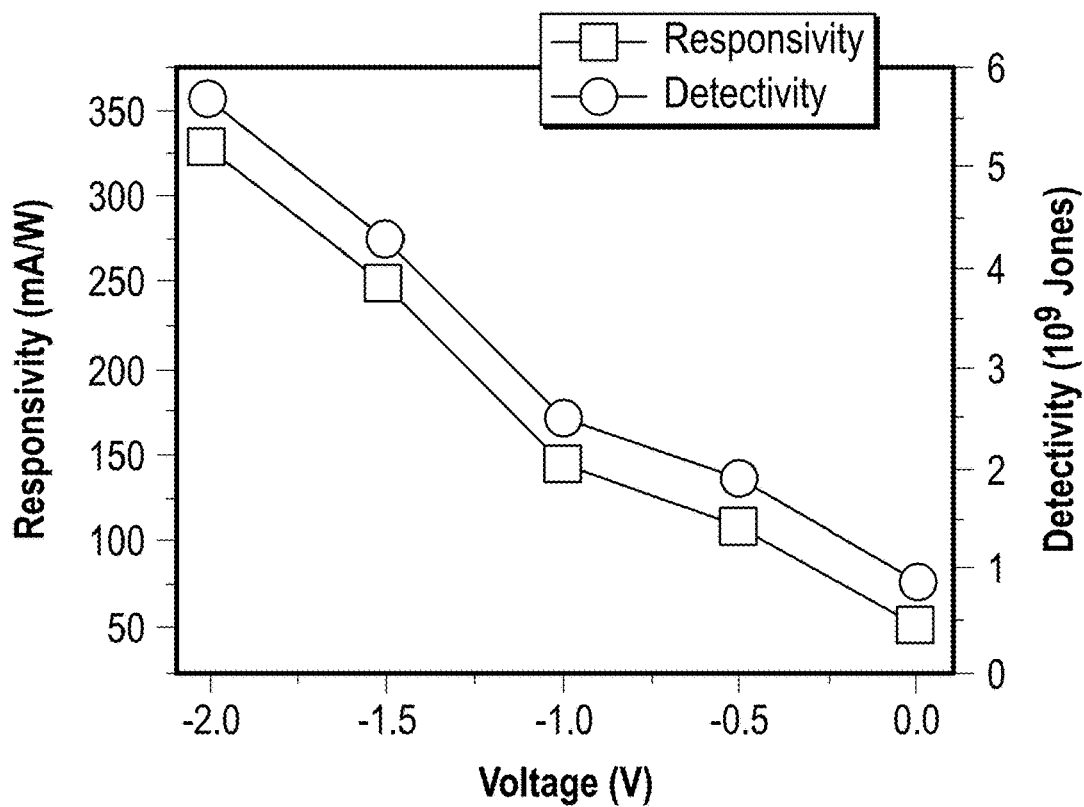
FIG. 7E illustrates the responsivity and detectivity of the wire shaped perovskite photodetector as a function of bias voltage.
Figure 7F:
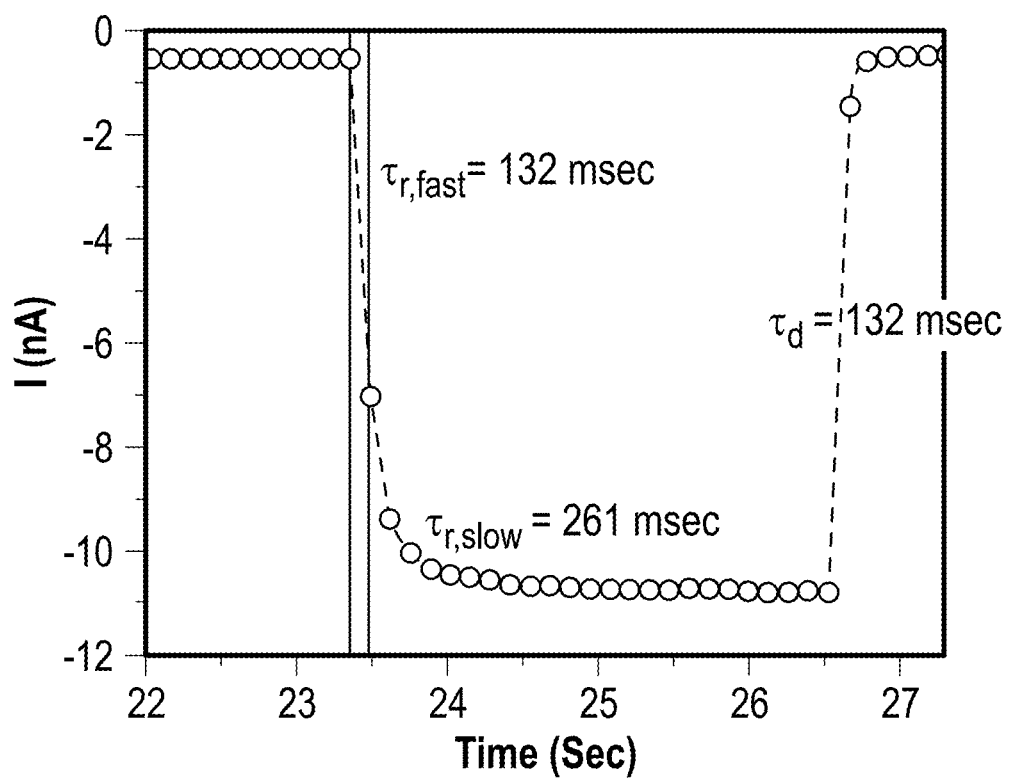
FIG. 7F illustrates the rise and fall time of the wire-shaped perovskite photodetector, according to one embodiment of the present disclosure.

Noting the direct dependence of bias voltage on the photo-response as seen in FIG. 7E, the CNY/perovskite/In/Ag photodetector was analyzed quantitatively with two parameters responsivity (R) and detectivity (D) using Equations 2 and 3. The incident light ($L_{light}$) was held constant while the $J_{ph}$ varied as a response to changing bias voltage. In order to calculate $J_{ph}$, the area was calculated as the diameter of the counter electrode multiplied by the diameter of the CNY/perovskite wire. The responsivity and detectivity at bias voltage of −2V under white light lamp source with intensity of 8.54 mW/cm² was found to be 330 mA/W and 5.73×10⁹ Jones, respectively. The prepared CNY/perovskite/In/Ag based photodetector shows superior responsivity than the photodetector device prepared from MWCNTF[54], SWCNTF[55], MWCNT/Graphene[56], SWCNT/PCBM [57] and SLG-CNTF[58] structures. The response time of the prepared photodetector was calculated using time dependent photocurrent measurement, as shown in FIG. 7F. The device shows fast response speed to white light (fast and slow rise time of 132 ms and 261 ms, and decay time of 132 ms). The extremely quick decay time indicates a lack of trap states within the crystalline structure, allowing the charges to completely settle to dark current within the measurement confines of the equipment used.

Figure 9A:
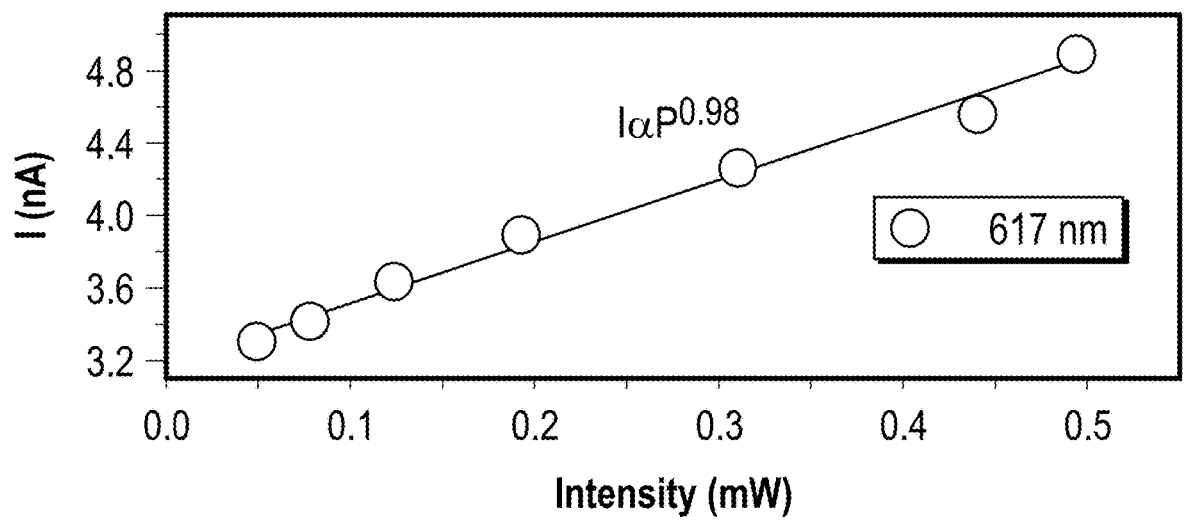
FIGS. 9A and 9B illustrate the photocurrent dependence of wire shaped perovskite photodetector with varying light intensity at 0V (A) 617 nm, (B) 585 nm, according to one embodiment of the present disclosure.
Figure 9B:
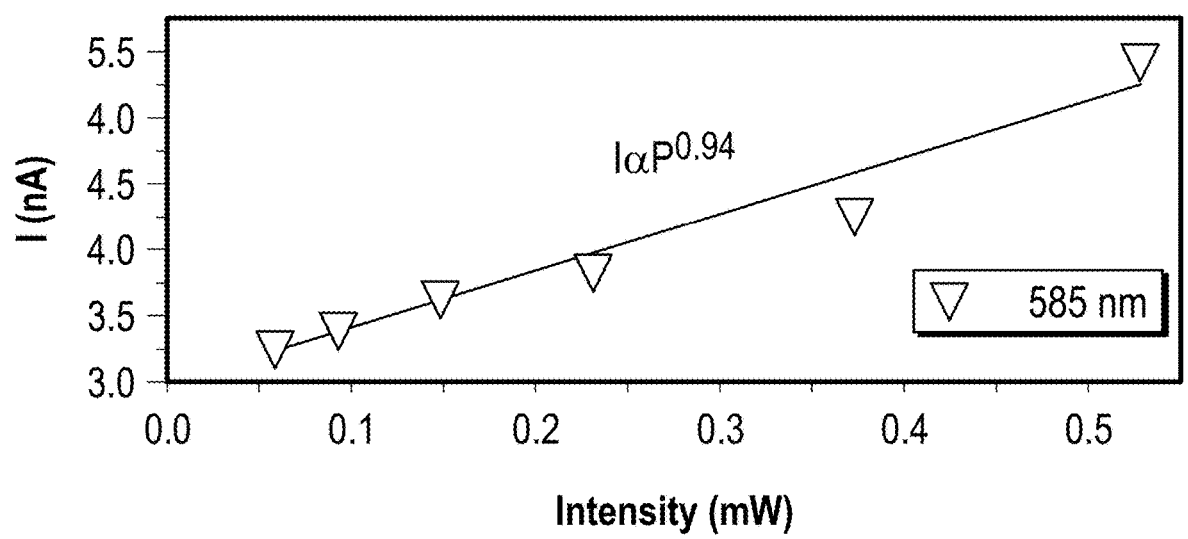

The performance of the wire shaped device under varying intensity showed a predictable response through its near linear photocurrent. The wire shaped device was fixed on an optic table while monochromatic light of 585 nm and 617 nm wavelength (unfiltered intensity at 0.592 mW and 0.493 mW respectively) was directed at the device. Filters (Newport FS-3R Neutral Density Set) at a fixed distance were then placed in the light path in order to vary the light intensities (0.05 to ~0.5 mW). FIGS. 9A and 9B show the linear response to both wavelengths, indicating a strong dependence on incident intensity. The relationship between photocurrent and light intensity was analyzed by fitting with power law: Ip=CP$^\theta$ where C is a constant for the incident light, and the exponent θ determines the sensitivity of photocurrent due to incident light intensity corresponding to 585 nm and 617 nm (0.5<θ<1). The value of θ for 585 nm and 617 nm incident light was found to be 0.94 and 0.98 as shown in FIGS. 9A and 9B. Such a higher value of θ close to unity suggests a low density of trap states in the CNY/perovskite/In/Ag photodetector.

Figure 9C:
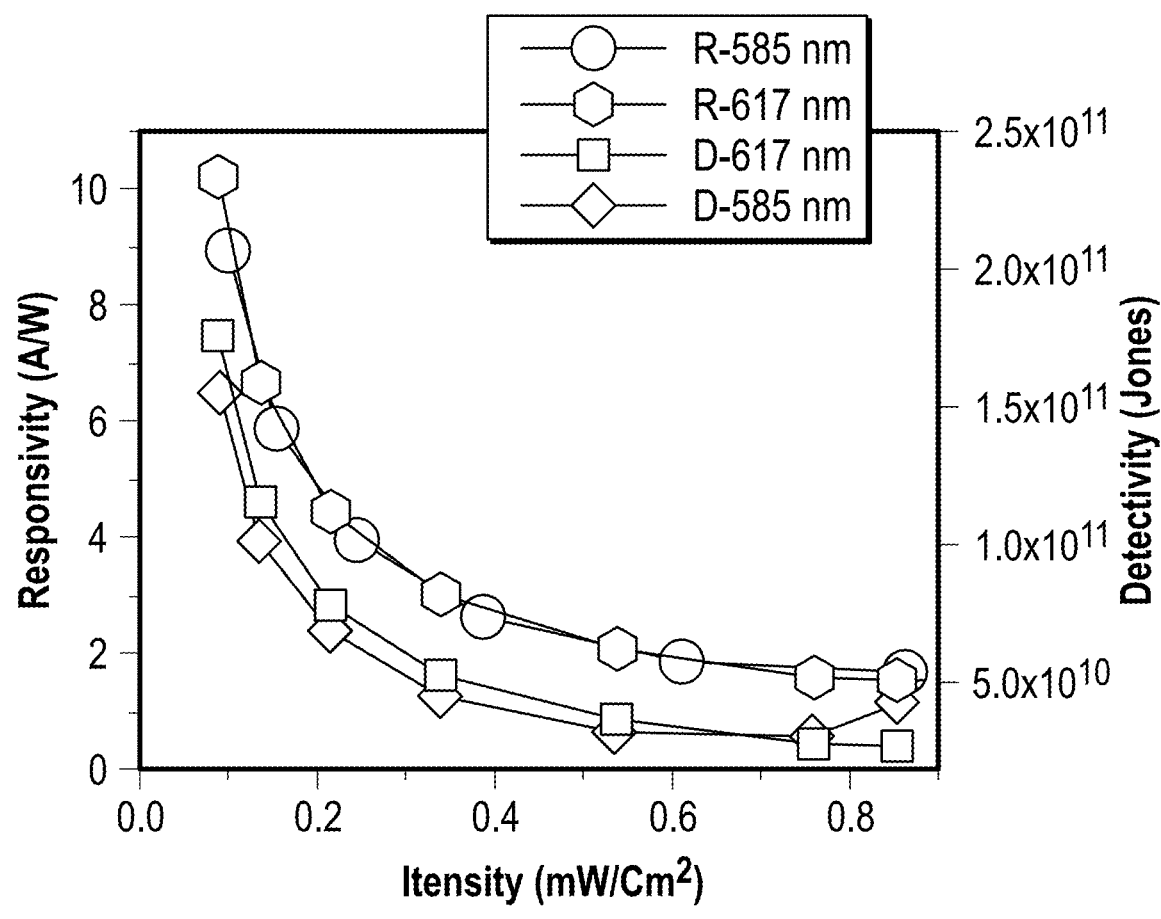
FIG. 9C illustrates the responsivity and detectivity of wire shaped perovskite photodetector at 585 nm and 617 nm wavelength, according to one embodiment of the present disclosure.

The linear dynamic range (LDR) in dB of the photodetector which is given by the following equation:

$$LDR = 20\log\frac{I_{photo}}{I_{dark}}$$

where $I_{photo}$ is the photocurrent generated with illumination level of 0.5 mW/cm². The LDR was found to be 53.6 dB, showing a linear response characteristic of the photodetector device. The responsivity and detectivity of the CNY/perovskite/In/Ag based flexible photodetector was studied with low light intensity from 0 to ~0.9 mw/cm² to further understand the light intensity dependent photo response. As shown in FIG. 9C, the responsivity and detectivity increases gradually with decreasing intensity. However, the responsivity and detectivity saturate with further increase of the intensity due to reduced charge carrier recombination rate at higher light intensity.

As can be seen from these results, the overall performance of this single step solution MAPbI₃ device is remarkable. When looking at the performance of the device in comparison to wire-shaped, flexible planar, and rigid planar devices in Table 1, it shows a very strong $I_{light}/I_{dark}$ ratio and response time. Noting that the complex 3D surface of wire-shaped devices presents challenges during fabrication, it is believed that a novel solution is disclosed herein that is able to compete with planar devices. We believe this is the first flexible perovskite photodetector reported.

TABLE 1

Performance Summary of Wire-Shaped, Flexible Planar, and Rigid Planar Photodetectors, with a focus on perovskite based devices

| Device | Bias (V) | Responsivity (A/W) | $I_{light}/I_{dark}$ | Response Time (s) | Type |
|---|---|---|---|---|---|
| Our Device | 0 | 10.2 | 45 | .393/.132 | Wire-Shaped |
| ZnO [59] | 1 | — | 4 | 7.5/8.6 | Wire-Shaped |
| NiO/ZnO [14] | −3.5 | 21.8 | 4.9 | —/18.1 | Wire-Shaped |
| ZnO [11] | 0 | 0.00996 | 2 | 1.5/6 | Wire-Shaped |
| ZnO [15] | −0.5 | 0.9 | 7.2 | 0.28/2.2 | Wire-Shaped |
| Perovskite [60] | 0 | 115 | — | .25/5.3 | Flexible Planar |
| Perovskite [61] | 0.6 | 0.101 | 29 | <2 | Flexible Cloth |
| Perovskite/ZnO [62] | 0 | 24.3 | — | .7/.6 | Planar |

Figure 10:
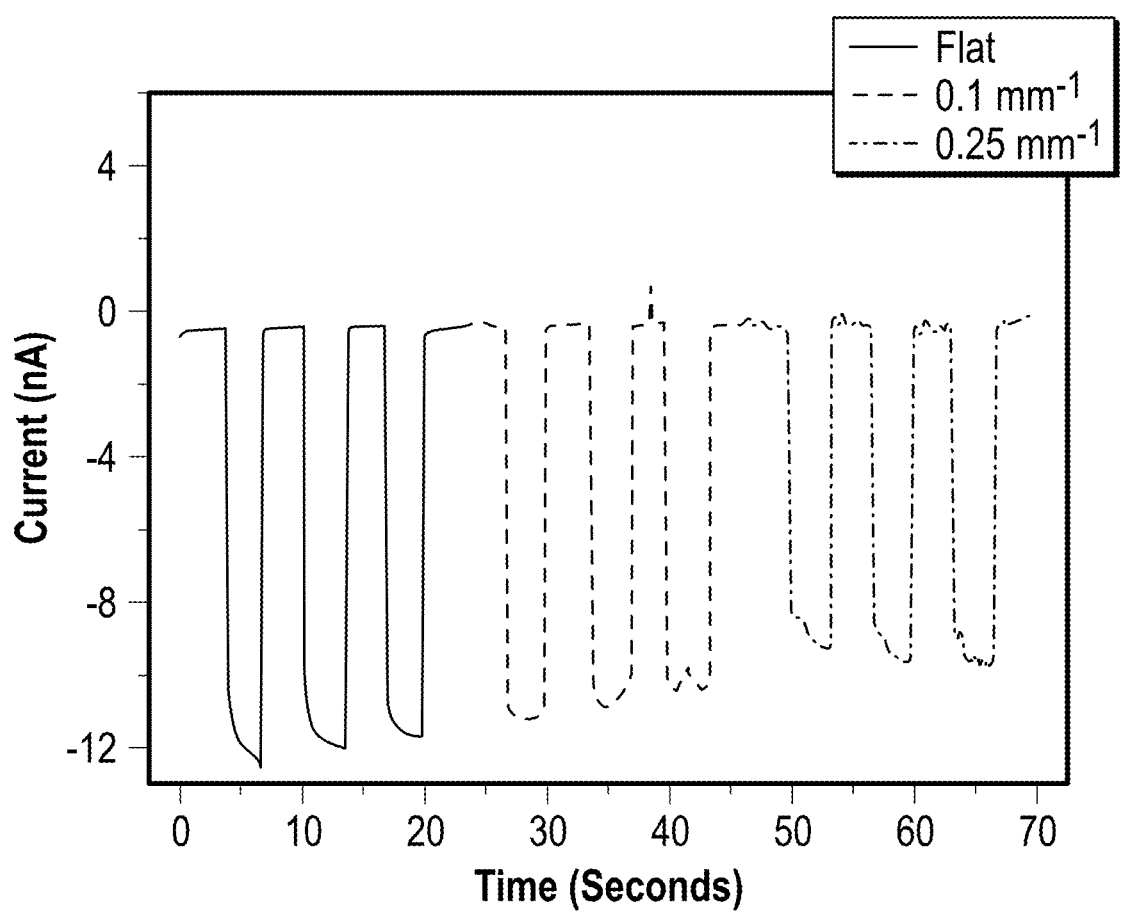
FIG. 10 illustrates the time-dependent current responses of wire shaped perovskite photodetector with flat, 0.1 $mm^{-1}$, and 0.25 $mm^{-1}$ radii of curvatures, according to some embodiments of the present disclosure.

These flexible devices may be embedded into carbon fiber composites, for example to produce multifunctional composites and for use, for example, in-situ structural health monitoring (SHM). In order to test weavability, the devices were tested on 3D printed curves in order to hold the specimen in shape and simulate a woven environment. The mechanical stability of the photodetectors was studied with bending tests with structures having radii of curvatures: 0 mm-1 (flat), 0.1 mm-1, and 0.25 mm-1 as shown in FIG. 10. Time dependent photocurrent response was measured as a function of strain. The photodetectors were found to be photo responsive as changing the radii of curvature from flat to 0.25 mm-1. The comparable photocurrent was obtained while increasing the strain for curvatures from flat to 0.25 mm-1. This proves that the perovskite based flexible photodetector on CNY possessed the high flexibility and durability, which can further extend its applications in SHM.

Modifications and variations of the methods and devices described herein will be obvious to those skilled in the art from the foregoing detailed description. Such modifications and variations are intended to come within the scope of the appended claims.

REFERENCES

1. Weckler, G. *A silicon photodevice to operate in a photon flux integrated mode*. in *Electron Devices Meeting, 1965 International*. 1965. IEEE.
2. Becquerel, A., *Mémoire sur les effets électriques produits sous l'influence des rayons solaires*. Comptes Rendus 9: 561-567. Originalarbeit zur Einwirkung von Licht auf Elektroden, 1839.
3. Sukhovatkin, V., et al., *Colloidal quantum-dot photodetectors exploiting multiexciton generation*. Science, 2009. 324(5934): p. 1542-44.
4. Schilinsky, P., et al., *Polymer photovoltaic detectors: progress and recent developments*. Thin solid films, 2004. 451: p. 105-108.
5. Jin, Y., et al., *Solution-processed ultraviolet photodetectors based on colloidal ZnO nanoparticles*. Nano letters, 2008. 8(6): p. 1649-53.
6. Haugan, H., et al., *Study of residual background carriers in midinfrared In As/Ga Sb superlattices for uncooled detector operation*. Applied Physics Letters, 2008. 92(7): p. 071102.
7. Gan, X., et al., *Chip-integrated ultrafast graphene photodetector with high responsivity*. Nature Photonics, 2013. 7(11): p. 883-887.
8. Binet, F., et al., *Mechanisms of recombination in GaN photodetectors*. Applied physics letters, 1996. 69(9): p. 1202-1204.
9. Song, Z., et al., *Pathways toward high-performance perovskite solar cells: review of recent advances in organo-metal halide perovskites for photovoltaic applications*. Journal of Photonics for Energy, 2016. 6(2): p. 022001-022001.
10. Zhang, X., et al., *Enhancing the brightness of cesium lead halide perovskite nanocrystal based green light-emitting devices through the interface engineering with perfluorinated ionomer*. Nano Lett, 2016. 16(2): p. 1415-20.
11. Dong, Y., et al., *Self-powered fiber-shaped wearable omnidirectional photodetectors*. Nano Energy, 2016. 30: p. 173-79.
12. Lee, M., Y. Ko, and Y. Jun, *Efficient fiber-shaped perovskite photovoltaics using silver nanowires as top electrode*. Journal of Materials Chemistry A, 2015. 3(38): p. 19310-13.
13. NREL. *Energy Technology Cost and Performance Data for Distributed Generation*. 2016; Available from: http://www.nrel.gov/analysis/tech_footprint.html.
14. Ko, Y. H., G. Nagaraju, and J. S. Yu, *Wire-shaped ultraviolet photodetectors based on a nanostructured NiO/ZnO coaxial p-n heterojunction via thermal oxidation and hydrothermal growth processes*. Nanoscale, 2015. 7(6): p. 2735-42.
15. Zhu, Z., et al., *Boosting Fiber-Shaped Photodetectors via "Soft" Interfaces*. ACS Applied Materials & Interfaces, 2017. 9(13): p. 12092-99.
16. Olawale, D. O., et al., *In pursuit of bio-inspired triboluminescent multifunctional composites*, in *Mechanics of Composite and Multi functional Materials*, Volume 7. 2016, Springer. p. 55-65.
17. Olawale, D. O., et al., *Progress in triboluminescence-based smart optical sensor system*. Journal of Luminescence, 2011. 131(7): p. 1407-18.
18. Dickens, T. J. and O. I. Okoli, *Enabling damage detection: manufacturing composite laminates doped with dispersed triboluminescent materials*. J. Reinforced Plastics and Composites, 2011. 30(22): p. 1869-76.

19. Li, R., et al., *Wearable Double-Twisted Fibrous Perovskite Solar Cell*. Advanced Materials, 2015. 27(25): p. 3831-35.
20. Peng, M. and D. Zou, *Flexible fiber/wire-shaped solar cells in progress: Properties, materials, and designs*. Journal of Materials Chemistry A, 2015. 3(41): p. 20435-20458.
21. Tang, S., et al., *Composition Engineering in Doctor-Blading of Perovskite Solar Cells*. Advanced Energy Materials, 2017.
22. Deng, Y., et al., *Scalable fabrication of efficient organolead trihalide perovskite solar cells with doctor-bladed active layers*. Energy & Environmental Science, 2015. 8(5): p. 1544-1550.
23. Barrows, A. T., et al., *Efficient planar heterojunction mixed-halide perovskite solar cells deposited via spray-deposition*. Energy & Environmental Science, 2014. 7(9): p. 2944-2950.
24. Chai, G., et al., *PbI2 platelets for inverted planar organolead Halide Perovskite solar cells via ultrasonic spray deposition*. Semiconductor Sci. & Technology, 2017. 32(7): p. 074003.
25. Tzounis, L., et al., *Perovskite solar cells from small scale spin coating process towards roll-to-roll printing: optical and morphological studies*. Materials Today: Proceedings, 2017. 4(4): p. 5082-89.
26. Song, D.-h., et al., *Reproducible formation of uniform $CH_3NH_3PbI_{3-x}Cl_x$ mixed halide perovskite film by separation of the powder formation and spin-coating process*. J. Power Sources, 2016. 310: p. 130-36.
27. Jeon, N. J., et al., *Solvent engineering for high-performance inorganic-organic hybrid perovskite solar cells*. Nature materials, 2014. 13(9): p. 897-903.
28. Dou, L., et al., *Solution-processed hybrid perovskite photodetectors with high detectivity*. Nature communications, 2014. 5: p. 5404.
29. He, S., et al., *Radically grown obelisk-like ZnO arrays for perovskite solar cell fibers and fabrics through a mild solution process*. Journal of Materials Chemistry A, 2015. 3(18): p. 9406-10.
30. Adhikari, N., et al., *Crystallization of a perovskite film for higher performance solar cells by controlling water concentration in methyl ammonium iodide precursor solution*. Nanoscale, 2016. 8(5): p. 2693-703.
31. Grätzel, M., *The light and shade of perovskite solar cells*. Nature materials, 2014. 13(9): p. 838-842.
32. Chiechi, R. C., et al., *Eutectic Gallium-Indium (EGaIn): A Moldable Liquid Metal for Electrical Characterization of Self-Assembled Monolayers*. Angewandte Chemie, 2008. 120(1): p. 148-50.
33. Wang, Q., et al., *Large fill factor bilayer iodine perovskite solar cells fabricated by a low-temperature solution-process*. Energy & Environmental Science, 2014. 7(7): p. 2359-65.
34. Eperon, G. E., et al., *Morphological control for high performance, solution-processed planar heterojunction perovskite solar cells*. Advanced Functional Materials, 2014. 24(1): p. 151-157.
35. Venkatesan, S., et al., *Benzothiadiazole-based polymer for single and double junction solar cells with high open circuit voltage*. Nanoscale, 2014. 6(12): p. 7093-100.
36. Glatzel, T., et al., *CuGaSe 2 solar cell cross section studied by Kelvin probe force microscopy in ultrahigh vacuum*. Applied physics letters, 2002. 81(11): p. 2017-19.
37. Venkatesan, S., et al., *Interplay of nanoscale domain purity and size on charge transport and recombination dynamics in polymer solar cells*. Nanoscale, 2014. 6(2): p. 1011-19.
38. Yun, J. S., et al., *Benefit of grain boundaries in organic-inorganic halide planar perovskite solar cells*. The Journal of Physical Chemistry Letters, 2015. 6(5): p. 875-80.
39. Jiang, C.-S., et al., *Carrier separation and transport in perovskite solar cells studied by nanometre-scale profiling of electrical potential*. Nature communications, 2015. 6.
40. Dymshits, A., et al., *The electronic structure of metal oxide/organo metal halide perovskite junctions in perovskite based solar cells*. Scientific reports, 2015. 5.
41. Adhikari, N., et al., *Interfacial study to suppress charge carrier recombination for high efficiency Perovskite solar cells*. ACS applied materials & interfaces, 2015. 7(48): p. 26445-26454.
42. Tidhar, Y., et al., *Crystallization of methyl ammonium lead halide perovskites: implications for photovoltaic applications*. J. American Chemical Society, 2014. 136 (38): p. 13249-56.
43. Dirksen, J. and T. Ring, *Fundamentals of crystallization: kinetic effects on particle size distributions and morphology*. Chemical Engineering Science, 1991. 46(10): p. 2389-427.
44. Rong, Y., et al., *Critical kinetic control of non-stoichiometric intermediate phase transformation for efficient perovskite solar cells*. Nanoscale, 2016. 8(26): p. 12892-12899.
45. Zhang, S., et al., *Preparations and characterizations of luminescent two dimensional organic-inorganic perovskite semiconductors*. Materials, 2010. 3(5): p. 3385-406.
46. Al Mamun, A., et al., *A deconvoluted PL approach to probe the charge carrier dynamics of the grain interior and grain boundary of a perovskite film for perovskite solar cell applications*. Physical Chemistry Chemical Physics, 2017. 19(13): p. 9143-48.
47. Namkoong, G., et al., *Chemically, spatially, and temporally resolved 2D mapping study for the role of grain interiors and grain boundaries of organic-inorganic lead halide perovskites*. Solar Energy Materials and Solar Cells, 2016. 155: p. 134-40.
48. Zhang, W., et al., *Enhanced optoelectronic quality of perovskite thin films with hypophosphorous acid for planar heterojunction solar cells*. Nature communications, 2015. 6: p. 10030.
49. Cui, P., et al., *Reduced surface defects of organometallic perovskite by thermal annealing for highly efficient perovskite solar cells*. RSC Advances, 2015. 5(92): p. 75622-29.
50. Yan, J., et al., *3D Sensing Using Solid-State Wire-Shaped Photovoltaic Sensor in TL-Based Structural Health Monitoring*, in Triboluminescence. 2016, Springer. p. 351-77.
51. Xiang, D., et al., *Surface Transfer Doping-Induced, High-Performance Graphene/Silicon Schottky Junction-Based, Self-Powered Photodetector*. Small, 2015. 11(37): p. 4829-36.
52. Michaelson, H. B., *The work function of the elements and its periodicity*. Journal of applied physics, 1977. 48(11): p. 4729-4733.
53. Chen, Q., et al., *Controllable self-induced passivation of hybrid lead iodide perovskites toward high performance solar cells*. Nano letters, 2014. 14(7): p. 4158-4163.
54. Lu, R., et al., *High performance multiwall carbon nanotube bolometers*. J. Applied Physics, 2010. 108(8): p. 084305.

55. Zeng, Q., et al., *Carbon nanotube arrays based high-performance infrared photodetector*. Optical Materials Express, 2012. 2(6): p. 839-848.
56. Lu, R., et al., *High photoresponse in hybrid graphene-carbon nanotube infrared detectors*. ACS applied materials & interfaces, 2013. 5(22): p. 11703-07.
57. Xie, Y., et al., *Broad-Spectral-Response Nanocarbon Bulk-Heterojunction Excitonic Photodetectors*. Advanced Materials, 2013. 25(25): p. 3433-37.
58. Zhang, T.-F., et al., *Broadband photodetector based on carbon nanotube thin film/single layer graphene Schottky junction*. Scientific reports, 2016. 6.
59. Chen, J., et al., *Strain-enhanced cable-type 3D UV photodetecting of ZnO nanowires on a Ni wire by coupling of piezotronics effect and pn junction*. Optics express, 2014. 22(3): p. 3661-3668.
60. Dang, V. Q., et al., *Methylammonium lead iodide perovskite-graphene hybrid channels in flexible broadband phototransistors*. Carbon, 2016. 105: p. 353-361.
61. Sun, H., et al., *Self-Powered, Flexible, and Solution-Processable Perovskite Photodetector Based on Low-Cost Carbon Cloth*. Small, 2017.
62. Yu, J., et al., *A high-performance self-powered broadband photodetector based on a $CH_3NH_3PbI_3$ perovskite/ZnO nanorod array heterostructure*. J. Materials Chemistry C, 2016. 4(30): p. 7302-08.

We claim:

1. A device comprising:
   a wire-shaped semi-conductor substrate comprising a carbon nanotube yarn; and
   a perovskite coating on an outer surface of the wire-shaped semi-conductor substrate.
2. The device of claim 1, wherein the pervoskite coating is substantially uniform in thickness both in the axial direction of the substrate and in the radial direction of the substrate.
3. The device of claim 1, wherein the wire-shaped semi-conductor substrate is a carbon nanotube rope.
4. The device of claim 3, wherein the carbon nanotube rope has a diameter of about 400 µm.
5. The device of claim 3, wherein the carbon nanotube rope comprises at least four twisted carbon nanotube yarns.
6. The device of claim 1, wherein the perovskite coating is crystalline with preferential grain growth at (110) plane.
7. The device of claim 1, wherein the perovskite coating comprises $CH_3NH_3PbI_3$.
8. The device of claim 1, wherein the device is, or is part of, a photodetector.
9. The device of claim 8, which exhibits a substantially linear response to an applied bias voltage.
10. The device of claim 1, wherein the device is, or is part of, a solar cell.
11. The device of claim 1, wherein the device is, or is part of, a light emitting diode (LED).
12. A method of making a wire-shaped perovskite device, the method comprising:
    depositing a perovskite solution onto an outer surface of a wire-shaped semi-conductor substrate; and then
    annealing the deposited perovskite solution by Joule heating to produce a perovskite coating on the wire-shaped semi-conductor substrate; and
    optionally, repeating said depositing and annealing in order to build successive layers of the perovskite coating on the wire-shaped semi-conductor substrate.
13. The method of claim 12, wherein the annealing by Joule heating comprises connecting an indium gallium top electrode to the wire-shaped semi-conductor substrate.
14. The method of claim 12, wherein the perovskite solution comprises a $CH_3NH_3I:PbI_2$ solution.
15. The method of claim 12, wherein the wire-shaped semi-conductor substrate is a carbon nanotube rope comprising at least four twisted carbon nanotube yarns.
16. The method of claim 12, wherein the perovskite coating comprises $CH_3NH_3PbI_3$.
17. A wire-shaped photodetector comprising:
    a flexible wire-shaped semi-conductor substrate comprising carbon nanotube yarn; and
    a crystalline perovskite coating annealed onto an outer surface of the wire-shaped semi-conductor surface.
18. The photodetector of claim 17, wherein the perovskite coating comprises crystal sizes greater than 0.75 microns.
19. The method of claim 12, wherein the pervoskite coating is substantially uniform in thickness both in the axial direction of the substrate and in the radial direction of the substrate.
20. The method of claim 12, wherein the wire-shaped semi-conductor substrate comprises a carbon nanotube yarn.

* * * * *